(12) United States Patent
Maleki et al.

(10) Patent No.: US 9,500,538 B2
(45) Date of Patent: Nov. 22, 2016

(54) METHOD AND APPARATUS FOR DETERMINING A THERMAL STATE OF A BATTERY TAKING INTO ACCOUNT BATTERY AGING

(71) Applicant: MOTOROLA MOBILITY LLC, Libertyville, IL (US)

(72) Inventors: Hossein Maleki, Suwanee, GA (US); Jason N. Howard, Alpharetta, GA (US)

(73) Assignee: Google Inc., Mountain View, CA (US)

(*) Notice: Subject to any disclaimer, the term of this patent is extended or adjusted under 35 U.S.C. 154(b) by 607 days.

(21) Appl. No.: 13/959,769

(22) Filed: Aug. 6, 2013

(65) Prior Publication Data

US 2014/0269811 A1    Sep. 18, 2014

Related U.S. Application Data

(60) Provisional application No. 61/783,949, filed on Mar. 14, 2013.

(51) Int. Cl.
| | |
|---|---|
| G01K 13/00 | (2006.01) |
| H02J 7/16 | (2006.01) |
| G01K 15/00 | (2006.01) |
| H01M 10/48 | (2006.01) |
| G01R 31/36 | (2006.01) |

(52) U.S. Cl.
CPC .............. G01K 13/00 (2013.01); G01K 15/005 (2013.01); H01M 10/486 (2013.01); G01R 31/3606 (2013.01); G01R 31/3675 (2013.01); G01R 31/3679 (2013.01)

(58) Field of Classification Search
USPC ............. 320/151, 153; 374/100, 152, 45, 57
See application file for complete search history.

(56) References Cited

U.S. PATENT DOCUMENTS

| | | | |
|---|---|---|---|
| 2,550,344 A | 4/1951 | Godshalk | |
| 4,234,839 A | 11/1980 | King et al. | |
| 7,375,498 B2 | 5/2008 | Yamamoto | |
| 7,573,275 B2 | 8/2009 | Inagaki et al. | |
| 7,986,130 B2 | 7/2011 | Yen | |
| 8,035,346 B2 | 10/2011 | Tsai | |
| 8,193,744 B2 | 6/2012 | Steiner et al. | |
| 2004/0128089 A1* | 7/2004 | Barsoukov | G01R 31/3662 702/65 |
| 2007/0120537 A1* | 5/2007 | Yamamoto | G01R 31/3679 320/150 |
| 2008/0164849 A1* | 7/2008 | Ciaramitaro | H01M 10/345 320/151 |
| 2011/0161025 A1* | 6/2011 | Tomura | G01R 31/3651 702/63 |
| 2011/0264381 A1* | 10/2011 | Gering | H01M 10/48 702/32 |
| 2012/0091966 A1* | 4/2012 | Mori | H01M 10/44 320/134 |

* cited by examiner

*Primary Examiner* — Mirellys Jagan
*Assistant Examiner* — Nasir U Ahmed
(74) *Attorney, Agent, or Firm* — McDonnell Boehnen Hulbert & Berghoff LLP

(57) ABSTRACT

An electronic system, or its battery thermal management system, determines a thermal state of a battery used in the electronic system. A temperature at a position proximate the battery's cell is sensed during operation of the electronic system to produce a sensed value. Additionally, a temperature offset value is determined based on an aging factor for the battery. The sensed value is then adjusted based on the offset value to produce an adjusted value representative of the thermal state of the battery. According to one embodiment, a relationship between temperature offset value and battery aging factor is prestored in a memory of the electronic system. In such a case, the offset value may be retrieved from memory periodically or in response to a trigger event based on a determined aging factor. According to another embodiment, the offset value may be computed in real time based on a determined aging factor.

29 Claims, 4 Drawing Sheets

METHOD AND APPARATUS FOR DETERMINING A THERMAL STATE OF A BATTERY TAKING INTO ACCOUNT BATTERY AGING

FIELD OF THE INVENTION

The present invention relates generally to systems for thermally managing batteries used in electronic systems and, more particularly, to a method and apparatus for determining a thermal state of a battery used in an electronic system taking into account battery aging.

BACKGROUND

Mobile and portable electronic systems, such as smartphones, tablet computers, multimedia devices, motor vehicles, airplanes, and various other mobile and portable processor-based systems, employ one or more rechargeable batteries to supply electrical power to their electronic components. While various battery technologies have been utilized over the years, lithium-based batteries (e.g., lithium, lithium-ion, and lithium-polymer) have been chosen more recently for most mobile and portable battery applications. Lithium-based batteries hold their charge longer than other batteries, are recyclable, are lighter-weight than other batteries, are low maintenance (e.g., do not need periodic discharging and have no battery memory), and offer higher voltages and energy densities than other batteries, resulting in less cells needed for desired battery voltages. However, lithium-based batteries are not without their disadvantages. For example, such batteries require thermal protection circuits to maintain safe operation. Such circuits limit the peak voltage or state of charge of each cell during charge and limit maximum current during discharge. In addition, the thermal protection circuits monitor battery or cell temperature to prevent temperature extremes. Allowing a battery to get too hot can have serious consequences, including battery failure and possible safety consequences. Finally, the internal resistances of lithium-based batteries increase with age (e.g., charge-discharge cycles), which causes the voltage at the terminals of a battery to drop under load, reduces maximum current draw, and reduces deliverable energy density. Additionally, the increased resistance associated with aging causes the battery cell to generate more heat during operation for a consistent amount of supplied current.

To monitor the temperature of a lithium-ion battery, a thermal management or protection circuit typically includes a thermistor positioned on a printed circuit board (PCB) adjacent the cell or cells of the battery. The thermistor changes its resistive properties in response to changes in temperature, thereby allowing a voltage applied across the thermistor to change as the temperature changes. The voltage versus temperature characteristics of the thermistor are typically stored in memory and used by a processor to determine the temperature sensed by the thermistor based on the voltage drop detected by across the thermistor.

To illustrate the use of a thermistor to sense the temperature of a battery cell, reference is made to FIG. 1, which depicts a cross-sectional view of a prior art electronic device 101 containing a battery. The electronic device 101 may be a smartphone or other electronic system, and the battery may include one or more cells 103 (one shown). In the configuration depicted in FIG. 1, the battery cell 103 resides under a microprocessor (μP) 109 attached to a circuit board 111. Such a vertical configuration is commonly used in small, lightweight electronic devices, such as smartphones, cellular phones, portable multimedia players, and tablet computers. A thermistor 105 is attached to a circuit board 107 such that the thermistor is positioned proximate the battery cell 103 and forms part of a thermal protection circuit that receives supply power from the cell 103 or an output regulation circuit (not shown).

During operation of the electronic device 101, a hot spot 113 on the battery cell 103 may occur due to self-heating of the cell 103 (e.g., due to the cell's internal resistance) and/or the effect of external heating surrounding the cell 103. For example, heating of the microprocessor 109 or other circuitry near the cell 103 and self-heating of the cell 103 during operation of the electronic device 101 can cause a hot spot 113 to occur on the cell 103. Additionally, depending on the size (area) of the cell 103, the location of the hot spot 113 may be a substantial distance 115 away from the thermistor 105. As a result, the temperature affecting the thermistor 105 (and accordingly sensed by the thermal protection circuit as a result of the change in resistance of the thermistor 105) may be several degrees Celsius lower than the actual hot spot temperature. In the past, batteries were typically encased within an aluminum housing, and the thermistor was thermally coupled to the housing. The high conductivity of the housing allowed the thermistor to more closely track the hottest temperature of the battery. More recently, however, the aluminum housing has been replaced with a lightweight pouch made of aluminum foil encased within a laminate or polymer. Due to the presence of the polymer, the pouch provides poorer thermal conductivity than does the all-aluminum housing. As a result, hot spots more than a few millimeters away from the thermistor may not be accurately detected, and the thermal state of the battery may not be accurately monitored.

In an attempt to account for the poor thermal conductivity of the laminate pouch and the likelihood that cell hot spots may be a substantial distance away from the thermistor, prior art thermal protection systems include hard coded, fixed temperature offsets in their memories. The fixed offsets are typically determined based on lab testing of the thermal performances of the battery cells in the particular configurations of the electronic devices. Once determined, the offset is stored in memory and added by the processor to the sensed temperature (i.e., the temperature determined from the thermistor's voltage versus temperature curve based upon the output thermistor voltage) in order to arrive at the estimated maximum temperature of the cell. While a single fixed temperature offset provides some level of temperature compensation, it does not account for battery aging and, therefore, cannot accurately account for the increase in internal resistance, other changes in the cell's physical and thermal properties, and resultant increase in heating that occur as the battery ages.

Figure 1:
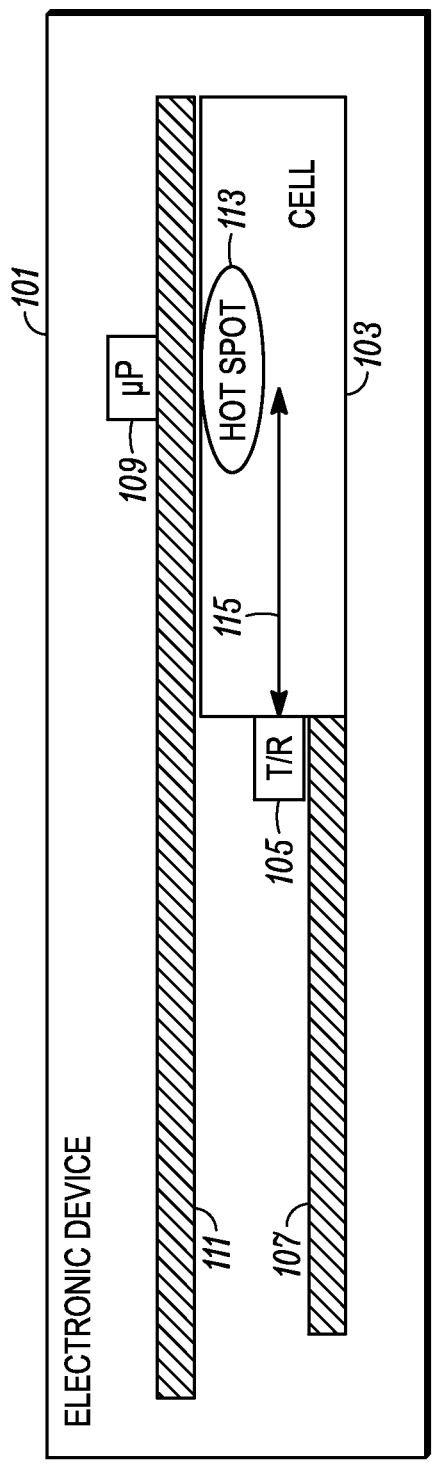
FIG. 1 is a cross-sectional view of a prior art electronic device containing a battery and illustrating the occurrence of a hot spot on a cell of the battery at a position that is distant from a temperature sensing device.

Skilled artisans will appreciate that elements in the figures are illustrated for simplicity and clarity and have not necessarily been drawn to scale. For example, the dimensions of some of the elements in the figures may be exaggerated alone or relative to other elements to help improve the understanding of the various exemplary embodiments of the present invention.

DETAILED DESCRIPTION

Generally, the present invention encompasses a method and apparatus for determining a thermal state of a battery used in an electronic system, which take into account battery aging. The battery may be a lithium-based battery or a battery of any technology that ages or exhibits characteristic changes over time. The electronic system in which the battery is used may be any system that utilizes one or more batteries for primary or auxiliary power. Accordingly, the electronic system may be, inter alia, a portable electronic device, such as a cell phone, smartphone, two-way radio, portable media player, tablet computer, laptop computer, personal digital assistant, handheld or portable gaming device, camera, camcorder, handheld GPS unit, wireless earpiece or headset, portable sensor, or portable health monitoring device, or a mobile electronic system that utilizes batteries for primary or auxiliary power, such as an electric vehicle, a hybrid electric vehicle, an electric-powered cycle, an airplane or other aerospace system, or a satellite.

According to one embodiment of the present invention, a temperature at a position proximate at least one cell of the battery is sensed during operation of the electronic system to produce a sensed temperature value. The temperature sensing may be performed by a processor or other processing circuit monitoring an output voltage of a temperature-sensitive device positioned adjacent or otherwise proximate to the battery cell(s). Additionally, a temperature offset value is determined for the battery based on an aging factor for the battery. The temperature offset value is an amount to be added or subtracted to the sensed temperature value to account for battery aging and provide a more accurate indication of the maximum temperature of the battery during operation of the electronic system. The temperature offset value may be calculated in real time (or quasi-real time) by a processor of the electronic system or may be retrieved from a memory based on a real-time aging factor for the battery. The aging factor for the battery may be any parameter or metric from which a change in the battery's operating properties can be determined. For example, the aging factor for the battery may be a cumulative capacity for the battery, a heat generation factor for the battery, an aged heat generation value for the battery, a quantity of charge-discharge cycles for the battery, or a quantity of charger insertions into a charging interface for the battery. The sensed temperature value is adjusted based on the temperature offset value to produce an adjusted temperature value representative of the thermal state of the battery. In one embodiment, the adjusted temperature value may be compared to a temperature threshold in order to determine whether to commence a thermal management event, such as instructing a user to reduce system usage, automatically terminating a charging process, or automatically reducing power to components of the electronic system. If the adjusted temperature value exceeds the threshold, the thermal management event may be commenced and a notice of the event may be displayed to a user on a display of the electronic system.

According to one embodiment of the present invention in which the battery aging factor is a quantity of charge-discharge cycles for the battery, the electronic system (e.g., via its processor) may detect a cumulative capacity of the battery during operation of the electronic system (e.g., through use of a conventional coulomb counter or battery fuel gauge) and determine the quantity of charge-discharge cycles based on the cumulative capacity. As used herein, "cumulative capacity" means the sum of all coulombs that have passed through the battery, either during charge or discharge, over the operating life of the battery. The quantity of charge-discharge cycles may be determined from the detected cumulative capacity by determining a ratio of the cumulative capacity to a full capacity for the battery. Alternatively, the quantity of charge-discharge cycles may be more accurately determined from the detected cumulative capacity by determining a ratio of the cumulative capacity to a full capacity for the battery, multiplying the ratio by a cycle life fade factor for the battery to produce an adjusted ratio, and summing the ratio and the adjusted ratio to produce the quantity of charge-discharge cycles. Further yet, the quantity of charge-discharge cycles may be even more precisely determined from the detected cumulative capacity by determining a ratio of the cumulative capacity to a full capacity for the battery, multiplying the ratio by a cycle life fade factor for the battery to produce an adjusted ratio, determining a quantity of partial charge cycles for the battery, multiplying the quantity of partial charge cycles by a partial charge factor to produce an adjusted quantity of partial charge cycles, summing the ratio and the adjusted ratio to produce a summation, and subtracting the adjusted quantity of partial charge cycles from the summation to produce the quantity of charge-discharge cycles.

For the latter alternative determination of the quantity of charge-discharge cycles, the partial charge factor may be determined by determining occurrences of a plurality of charging events for the battery (e.g., insertions of a battery charger into a charging interface), determining a state of charge for the battery at an end of each charging event, determining that a particular charging event is a partial charge cycle when the state of charge for the battery at the end of the particular charging event is less than a predetermined percentage of a full state of charge for the battery (e.g., less than 95% state of charge), and determining the quantity of partial charge cycles based on a quantity of charging events that qualify as partial charge cycles. According to one embodiment, the state of charge for the battery may be determined based on an open circuit output voltage of the battery at the end of each charging event. Alternatively, the state of charge may be determined by measuring coulomb count or device runtime, if current drawn from the battery is generally constant during operation of the electronic system containing the battery.

According to another embodiment of the present invention in which the battery aging factor is a heat generation factor for the battery, the battery aging factor may be determined by measuring an impedance of the battery during operation of the electronic system to produce an aged battery impedance, determining a quantity of heat generated by the battery during operation of the electronic system based on the aged battery impedance to produce an aged heat generation value, determining the heat generation factor based on the aged heat generation value. In accordance with one exemplary implementation of this embodiment, the heat generation factor may be determined by retrieving an initial heat generation value from a memory of the electronic system, subtracting the initial heat generation value from the aged heat generation value to produce a heat generation value difference, and dividing the heat generation value difference by the aged heat generation value to produce the heat generation factor. In such a case, the initial heat generation value represents the amount of heat generated by the battery prior to aging of the battery. In accordance with another exemplary implementation of this embodiment, the temperature offset value may be determined by retrieving an initial temperature offset value from a memory of the electronic system, multiplying the initial temperature offset value by the heat generation factor to produce a scaled initial temperature offset value, and summing the scaled initial temperature offset value and the initial temperature offset value to produce the temperature offset value. In such a case, the initial temperature offset value represents a temperature offset value applied to the sensed temperature value prior to aging of the battery. Additionally, the heat generation factor may be determined in the manner described above or in any other manner that includes similar mathematical relations using fundamental parameters of the battery (e.g., current, resistance, and/or voltage) other than the heat generation values described above.

According to another embodiment of the present invention in which the battery aging factor is an aged heat generation value for the battery, the battery aging factor may be determined by measuring an impedance of the battery during operation of the electronic system to produce an aged battery impedance, determining a quantity of heat generated by the battery during operation of the electronic system based on the aged battery impedance to produce the aged heat generation value for the battery, and retrieving, from a memory of the electronic system, a temperature offset value corresponding to the aged heat generation value for the battery. In this case, the relationship between temperature offset value and aged heat generation value for the battery would be pre-stored in the memory.

According to a further embodiment of the present invention, a thermal management system for a battery includes a temperature sensing circuit positioned proximate at least one cell of the battery and a processor operably coupled to the temperature sensing circuit. According to this embodiment, the temperature sensing circuit outputs a value (e.g., a voltage or current) representative of a sensed temperature. The processor determines a temperature offset value based on an aging factor for the battery and adjusts the value representative of the sensed temperature based on the temperature offset value to produce an adjusted temperature value representative of the thermal state of the battery. In alternative embodiments, the processor of the battery thermal management system may determine the battery aging factor and the temperature offset value in accordance with the several embodiments described above for doing so.

According to yet another embodiment of the present invention, an electronic system includes a battery including at least one cell, a temperature sensing circuit positioned proximate the cell or cells of the battery, and a processor operably coupled to the temperature sensing circuit. According to this embodiment, the temperature sensing circuit outputs a value representative of a sensed temperature. Additionally, the processor determines a temperature offset value based on an aging factor for the battery and adjusts the value representative of the sensed temperature based on the temperature offset value to produce an adjusted temperature value representative of the thermal state of the battery. In other words, this embodiment is directed to an electronic system that includes a battery and its thermal management system as described above. In accordance with one particular implementation, the electronic system further includes a display coupled to the processor, wherein the processor is further operable to cause a notification to be displayed on the display to inform a user of the electronic system that a thermal management event has been commenced in the event that the adjusted temperature value exceeds a pre-established or real time-generated threshold.

By accounting for battery aging in the determination of temperature offset value, the present invention provides a more accurate assessment of the thermal state of the battery than by simply relying on the output of a thermistor positioned adjacent the battery cell or adding a predetermined, fixed offset to the sensed temperature value. In this manner, the present invention provides for safer use of thermally managed batteries in mobile or portable electronic systems.

Figure 2:
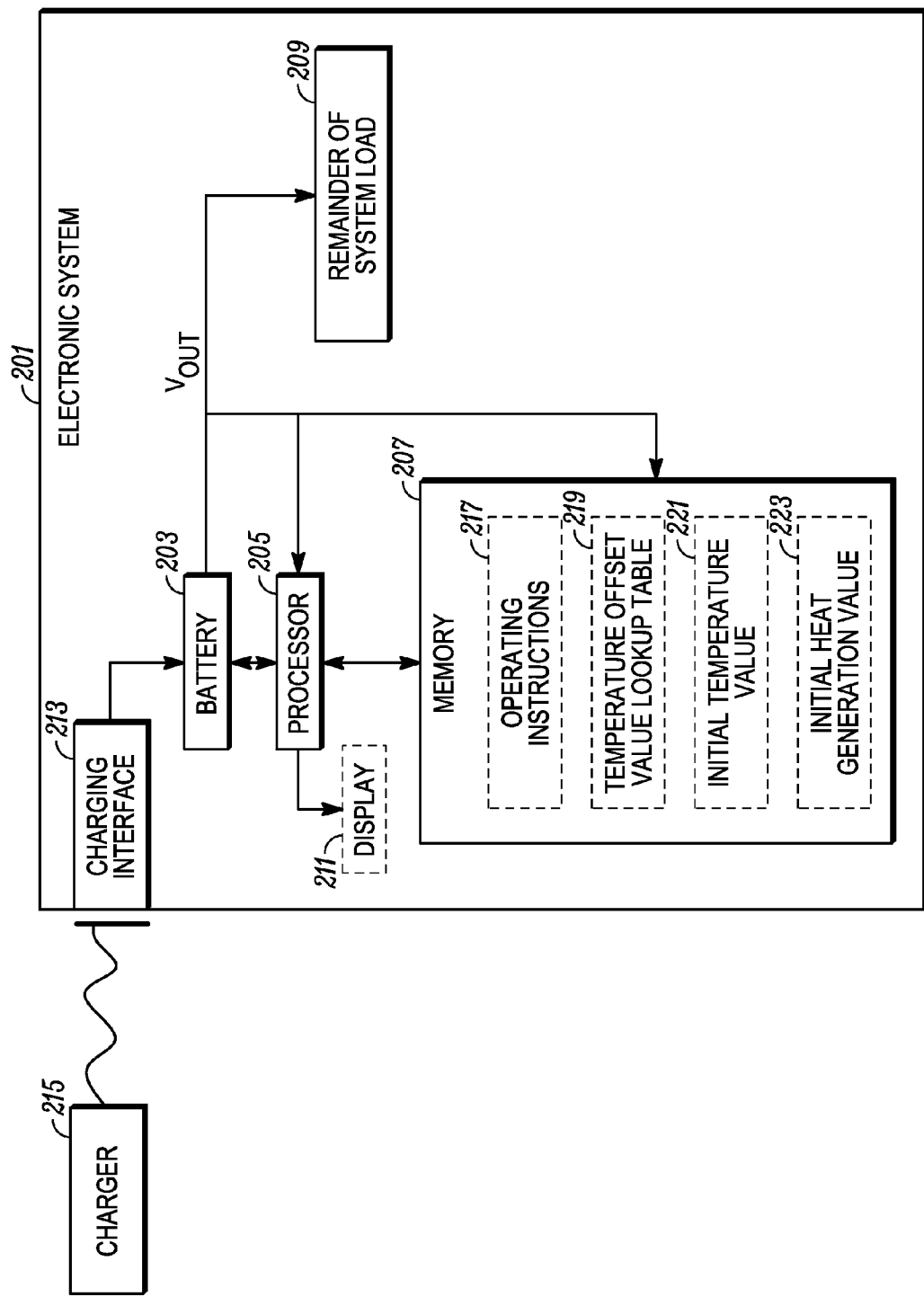
FIG. 2 is an electrical block diagram of an electronic system that includes a battery, in accordance with an exemplary embodiment of the present invention.
Figure 3:
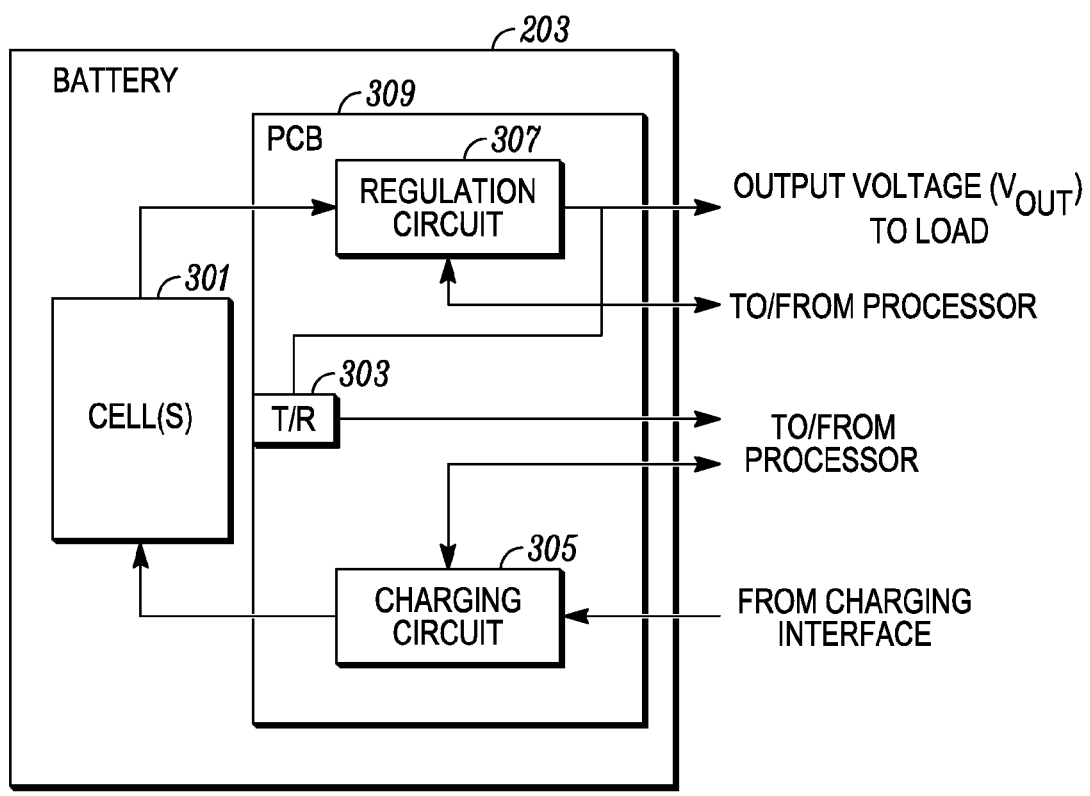
FIG. 3 is an electrical block diagram of an exemplary battery used in the electronic system of FIG. 2.
Figure 4:
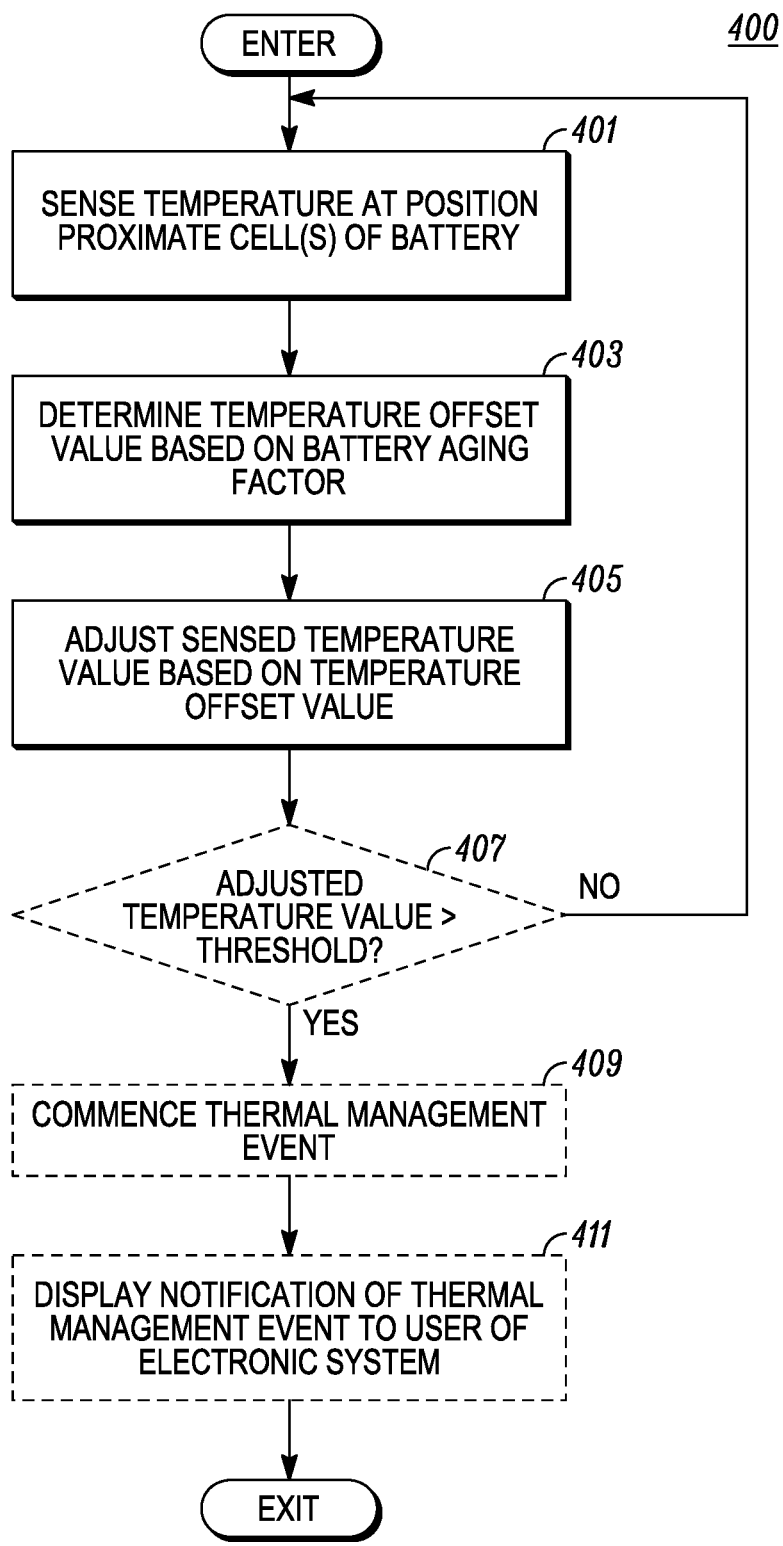
FIG. 4 is a logic flow diagram of steps executed by an electronic system and/or a processor used therein to determine a thermal state of a battery supplying electrical power to the electronic system, in accordance with an exemplary embodiment of the present invention.

Embodiments of the present invention can be more readily understood with reference to FIGS. 2-4, in which like reference numerals designate like items. FIG. 2 illustrates an electrical block diagram of an electronic system 201 that includes a battery 203, in accordance with an exemplary embodiment of the present invention. The electronic system 201 includes, inter alia, the battery 203, a processor 205, memory 207, a remainder of the system load 209, and an optional display 211. The various components used to implement the remainder of the system load 209 depend on the type of electronic system 201 and are not critical to an understanding of the present invention. Additionally, while only one battery 203 is depicted in the electronic system 201 of FIG. 2, one of ordinary skill in the art will readily appreciate that the electronic system 201 may include multiple batteries, such as would be the case where the electronic system was used in an electric vehicle or an airplane. Where the battery is rechargeable, the electronic system 201 may also include a charging interface 213 to facilitate connection of a charger 215 to the battery 203.

An electrical block diagram for an exemplary embodiment of the battery 203 is illustrated in FIG. 3. In this embodiment, the battery 203 includes one or more cells 301 (one shown), a temperature sensing circuit 303, a charging circuit 305, and a regulation circuit 307. The cell 301 may be a lithium-based cell (e.g., a lithium-ion cell) or a cell of any other battery technology that requires thermal management, such as nickel metal hydride, nickel cadmium, lead acid, or zinc air. The temperature sensing circuit 303, the charging circuit 305, and the regulation circuit 307 reside on a printed circuit board (PCB) 309 positioned adjacent the cell 301. The cell 301 and the printed circuit board 309 with its attached components may be packaged together to form a battery pack in accordance with known techniques.

The temperature sensing circuit 303 may include a thermistor (T/R) or any other electrical device that exhibits a predictable change in electrical characteristics over the allowable temperature range of the cell 301. The temperature sensing circuit 303 may include other components, such as resistors, capacitors, fuses, or switches, as may be necessary to produce a desirable range of outputs (e.g., output voltages) for sensing or detection by the processor 205.

The charging circuit 305 is a conventional charging circuit for the particular type of cell 301 and includes a counter readable by the processor 205 to enable the processor 205 to determine how many times the charging circuit received charging current from the charging interface 213 (and, accordingly, the charger 215). The charging circuit 305 may further include a processor-controllable switch to enable the processor 205 to terminate the supply of charging current in the event that a thermal management event is commenced. Further, the charging circuit 305 may optionally include a coulomb counter, a battery fuel gauge, a voltage detector, and/or other conventional circuitry for measuring the state of charge or state of health of the cell 301. The output of such state of charge or state of health circuitry may be supplied to or readable by the processor 205 for use in accordance with the present invention and for other purposes (e.g., to display a state of charge indicator on a display 211 of the electronic system 201).

The regulation circuit 307 may include resistors, diodes and various other conventional voltage regulation circuitry to produce a desired output voltage ($V_{out}$) to the components of the electronic system 201. The regulation circuit 307 may also include a coulomb counter, a battery fuel gauge, a voltage detector and other conventional circuitry for measuring the state of charge or state of health of the cell 301, especially where such state of charge or state of health circuitry is not included in the charging circuit 305. In another embodiment, the regulation circuit 307 may be combined with the charging circuit 305 to form a regulation and charging circuit. In such a case, the state of charge or state of health circuitry may be incorporated into the combined regulation and charging circuit.

Referring back to FIG. 2, the processor 205 may be a microprocessor, a microcontroller, a digital signal processor (DSP), a state machine, logic circuitry, or any other device or combination of devices that processes information based on operating or programming instructions 217 stored in the memory 207. One of ordinary skill in the art will appreciate that the processor 205 can be implemented using multiple processors as may be required to handle the processing requirements of the present invention and the various other included functions of the electronic system 201. One of ordinary skill in the art will further recognize that when the processor 205 has one or more of its functions performed by a state machine or logic circuitry, the memory containing the corresponding operating instructions 217 can be embedded within the state machine or logic circuitry as opposed to being external to the processor 205, as is the electronic system's internal memory 207 as illustrated in FIG. 2. In accordance with one embodiment of the present invention, the processor 205 in combination with the temperature sensing device 303 of the battery 203 and the memory 207 may form a thermal management system for the battery 203.

The memory 207 stores, inter alia, operating instructions 217 used by the processor 205 to implement various features of the present invention, including determining the thermal state of the battery 203 as described in more detail below, as well as optionally control operation of various components of the electronic system 201. Additionally, depending upon the chosen implementation of the present invention, the memory 207 may further store a temperature offset value lookup table 219, an initial temperature offset value 221, and/or an initial heat generation value 223. When used, the temperature offset lookup table 219 stores a relationship between temperature offset value and one or more aging factors for the battery 203. An aging factor for the battery 203 may be any parameter or metric from which a change in the battery's operating properties can be determined. For example, the aging factor for the battery 203 may be a cumulative capacity for the battery 203, a heat generation factor for the battery 203, an aged heat generation value for the battery 203, a quantity of charge-discharge cycles for the battery, or a quantity of charger insertions into a charging interface for the battery. The relationship between temperature offset value and the particular aging factor or factors may be measured in a test or factory environment and stored in the temperature offset lookup table 219, or another appropriate area of the memory 207, prior to initial use of the electronic system 201 by a user. Additionally, the initial temperature offset value 221 and the initial heat generation value 223, when used, may be determined through testing of a battery 203 prior to aging (e.g., when the battery 203 is new), as discussed in more detail below.

The memory 207 may be separate from the processor 205 as depicted in FIG. 2 or be integrated into the processor 205 as discussed above. The memory 207 can include random access memory (RAM), read-only memory (ROM), flash memory, electrically erasable programmable read-only memory (EEPROM), and/or various other forms of memory as are well known in the art. It will be appreciated by one of ordinary skill in the art that the various memory components can each be a group of separately located memory areas in the overall or aggregate device memory 207 and that the device memory 207 may include one or more individual memory elements. Although not illustrated in FIG. 2 or 3, the battery 203 may further include a memory (e.g., as part of a battery pack containing the battery 203 where, for instance, the battery implements a smart battery), which may be used to store the temperature offset value lookup table 219 (or equivalent relationships between temperature offset value and battery aging factor), the initial temperature offset value, the initial heat generation value, and/or other information or data as may be used by the electronic system 201 in connection with management or monitoring of the battery 203.

When included, the display 211 may be any conventional or future-developed display, such as a liquid crystal display (LCD), a plasma display, a light emitting diode (LED) display, an organic LED (OLED) display, or any other display technology. The display 211 includes appropriate conventional drivers and may optionally include graphics processors for illuminating various portions (e.g., pixels) of a display screen as instructed by the processor 205.

Operation of the electronic system 201 in accordance with exemplary embodiments of the present invention may be further understood with reference to FIGS. 2-4. Referring to FIG. 4, a logic flow diagram 400 is depicted illustrating steps executed by the electronic system 201 or a thermal management system for the battery 203, during operation of the electronic system 201, to determine a thermal state of the battery 203 in accordance with exemplary embodiments of the present invention. The logic flow steps may be executed by various components of the electronic system 201, including, but not limited to, the processor 205, the memory 207, the display 207, the thermal sensing circuit 303, the charging circuit 305, and the regulation circuit 307. The steps executed by the processor 205 are preferably performed in accordance with the operating instructions 217 (e.g., one or more computer programs) stored in the memory 207.

Prior to use of the electronic system 201 by a user, various data related to the present invention may have been prestored in the memory 207. Depending upon the particular embodiment of the present invention chosen to be implemented in the electronic system 201, the temperature offset lookup table 219, the initial temperature offset value 221, and/or the initial heat generation value 223 may have been determined and prestored in the memory 207. According to one embodiment, the determination of such information results from laboratory or factory testing of the battery 203. For example, once a battery technology has been selected for use in the electronic system 201, thermocouples may be attached to a new battery 203 to measure the temperatures at various locations of the battery 203 during operation of the electronic system 201. Additionally, the voltage provided from the temperature sensing circuit 303 can be processed by the processor 205 to determine the temperature of the battery 301 as sensed by the temperature sensing circuit 303 (e.g., by comparing the voltage to a lookup table representing a voltage versus temperature curve for the temperature sensing circuit 303 or by computing the temperature based on an equation defining the voltage versus temperature curve for the temperature sensing circuit 303). The difference between the temperature as determined by the processor 205 and the maximum temperature detected by the thermocouples is then recorded for each charge-discharge cycle of the battery 203 up to a predetermined quantity of charge-discharge cycles or until the battery 203 exhibits end-of-life characteristics. Each temperature difference is the temperature offset value that needs to be applied (added or subtracted, as applicable) to the temperature sensed by the temperature sensing circuit 303 to arrive at the maximum temperature detected by the thermocouples for the particular quantity of charge-discharge cycles. The resulting table of temperature offset values and charge-discharge cycles may then be used to create the temperature offset lookup table 219, where the aging factor for the battery 203 is quantity of charge-discharge cycles. The difference in temperature determined during the first charge-discharge cycle may be stored as the initial temperature offset value 221. Alternatively, the initial temperature offset value 221, and the temperature offset values in the lookup table 219, may be determined as the average temperature differences resulting from testing of a group of batteries 203 under similar operating conditions in the electronic system 201.

Alternatively, where heat generation factor or aged heat generation value may be used as the aging factor, the quantity of heat generated by the battery 203 during the cycle testing may be determined and recorded for use in producing a temperature offset lookup table 219 that stores a relationship between temperature offset value and heat generation factor and/or temperature offset value and aged heat generation value. In such a case, the battery output voltage and current may be measured periodically throughout the time period that the battery 203 is used in operation of the electronic system 201. At each measurement test point or time, the difference between the current output voltage and the prior output voltage $(V_2-V_1)$ is divided between the difference between the current output current and the prior output current $(I_2-I_1)$ to produce the impedance (R) of the battery for the current test point. The heat generation value (Q) is then determined for the battery by multiplying the determined impedance by the square of the measured output current $(I_2^2)$ (i.e., $Q=I_2^2 \times R$). When necessary in accordance with a particular embodiment of the present invention, the heat generation value computed based on the first two test points for a new battery 203 may be stored in the memory 207 as the initial heat generation value 223 for the battery 203. Alternatively, the heat generation values may be determined as the averages of heat generation values determined for a group of new batteries 203 tested under similar operating conditions in the electronic system 201.

Where a chosen embodiment of the battery's thermal management system relies upon a temperature offset value lookup table 219 to store a relationship between temperature offset value and aged heat generation value, the heat generation values computed for the voltage and current measurement test points may be recorded in association with temperatures as measured at such test points by the thermocouples attached to the battery 203 (e.g., temperature measured at test point N may be recorded in association with the heat generation value for test point N). The measured temperature may then be compared to the temperature determined by the processor 205 based on the voltage produced by the temperature sensing circuit 303 for the particular test point to determine the difference between the two temperatures and, thereby, produce the temperature offset value at the particular test point. The relationship between the temperature offset values and the heat generation values (aged heat generation values) may then be stored as the temperature offset value lookup table 219.

Where the chosen embodiment of the battery's thermal management system relies upon a temperature offset value lookup table 219 to store a relationship between temperature offset value and heat generation factor, a heat generation factor (HGF) may be determined for each voltage and current measurement test point based on the initial heat generation value ($Q_{new}$) and the heat generation value ($Q_{aged}$) as determined for the particular test point. In particular, the heat generation factor may be determined by determining a difference between the heat generation value determined for a particular test point and the initial heat generation value ($Q_{aged}-Q_{new}$) and dividing the difference by the heat generation value for the particular test point (i.e., $HGF=(Q_{aged}-Q_{new})/Q_{aged}$). The heat generation factors computed for the test points may be recorded in association with temperatures as measured at such test points by the thermocouples attached to the battery 203 (e.g., temperature measured at test point N may be recorded in association with the heat generation factor computed for test point N). The measured temperature may then be compared to the temperature determined by the processor 205 based on the voltage produced by the temperature sensing circuit 303 for the particular test point to determine the difference between the two temperatures and produce the temperature offset value at the particular test point. The relationship between the temperature offset values and the heat generation factors may then be stored in the memory 207 as the temperature offset value lookup table 219.

Referring back to FIG. 4, during operation of the electronic system 201, the processor 205 senses (401) the temperature of the battery 203 at a position proximate one or more cells 301 of the battery 203. According to one embodiment, a thermistor-based temperature sensing circuit 303 is positioned directly adjacent a cell 301 of the battery and produces an output voltage that changes based on the temperature affecting the temperature sensing circuit 303. The processor 205 detects the voltage generated by the thermistor-based temperature sensing circuit 303 and compares it to a lookup table representing the temperature versus voltage curve for the temperature sensing circuit 303 to determine the sensed temperature of the battery 203.

In addition to sensing a temperature proximate the battery cell 301, the processor 205 determines (403) a temperature offset value based on one or more battery aging factors. According to one embodiment, the processor 205 determines the temperature offset value by retrieving the temperature offset value from the electronic system memory 207 based on a battery aging factor, wherein a relationship between temperature offset value and battery aging factor was prestored in the memory 207. For example, the processor 205 may retrieve the temperature offset value from a prestored lookup table 219 based on the aging factor. With respect to such an embodiment, the aging factor may be any one of a cumulative capacity for the battery, a heat generation factor for the battery, an aged heat generation value for the battery, a quantity of charge-discharge cycles for the battery, or a quantity of charger insertions into a charging interface for the battery. Alternatively, the processor 205 may compute the temperature offset value in real time based on measuring one or more battery parameters, such as impedance, during operation of the electronic system 201.

For example, where the battery aging factor is a quantity of charge-discharge cycles and the temperature offset value lookup table 219 stores a relationship between temperature offset values and quantity of charge-discharge cycles as described above, the processor 205 may be required to compute the current quantity of charge-discharge cycles in real time during operation of the electronic system 201. According to one such embodiment, the processor 205 may detect a cumulative capacity of the battery 203 during operation of the electronic system 201 and determine the current quantity of charge-discharge cycles based on the cumulative capacity of the battery 203. To detect the cumulative capacity of the battery 203, the processor 205 may detect the current coulomb count or other capacity parameter for the battery 203 from a coulomb counter or fuel gauge forming part of the charging circuit 305 or regulation circuit 307 of the battery 203 in accordance with known techniques. In such a case, the output of the coulomb counter or fuel gauge may be provided as an input line to the processor 205. After the cumulative capacity of the battery 203 has been determined, the processor 205 may compute the quantity of charge-discharge cycles in a variety of ways. For example, the processor 205 may compute the quantity of charge-discharge cycles as a ratio of the cumulative capacity to a full capacity for the battery 203. The full capacity for the battery 203 may be determined for a new battery 203 in accordance with known techniques and a value for the full capacity of the battery 203 may be stored in the memory 207 for retrieval by the processor 205.

Alternatively, where more precision is desired in computing the quantity of charge-discharge cycles, the processor 205 may multiply the cumulative capacity-to-full capacity ratio by a cycle life fade factor for the battery 203 to produce an adjusted ratio and then sum the adjusted ratio with the original cumulative capacity-to-full capacity ratio to produce the quantity of charge-discharge cycles. In this case, the cycle life fade factor accounts for the degradation in the nominal or full capacity of the battery 203 over time and may be determined by decreasing the effective "full capacity" of the battery as a function of cycle number. For example, the adjusted full capacity (FCadj) may equal the full capacity of a new battery (FCnew) minus the product of quantity of charge-discharge cycles times cycle life fade factor (i.e., FCadj=FCnew−(#cycles×fadefactor)). Thus, the cycle life fade factor causes the quantity of charge-discharge cycles to increase more quickly than by relying only on the ratio of the cumulative capacity to the full capacity for the battery 203.

Where still further precision may be desired in computing the quantity of charge-discharge cycles, the processor 205 may determine a quantity of partial charge cycles for the battery 203, multiply the quantity of partial charge cycles by a partial charge factor to produce an adjusted quantity of partial charge cycles, and subtract the adjusted quantity of partial charge cycles from the sum of the cycle life factor-adjusted capacity ratio and the original cumulative capacity-to-full capacity ratio to produce the quantity of charge-discharge cycles. In this case, the quantity of partial charge cycles may be determined based on the quantity and types of charging events involving the battery 203. For example, the battery charging circuit 305 may be configured to detect and count, or detect and report to the processor 205, the occurrences of charging events when the charger 215 is connected to the charging interface 213 and supplying charging current to the battery cell 310. Additionally, the charging circuit 305 and/or the regulation circuit 307 may be further configured with a fuel gauge, coulomb counter, open circuit voltage detector, or other appropriate state of charge or state of health circuitry to determine a state of charge at the end of each charging event (e.g., after the battery 203 has reached full charge or after the charger 215 has been removed from the charging interface 213). Where the state of charge detection mechanism is open circuit voltage, the ending state of charge may be determined from a lookup table of open circuit voltage versus state of charge, as is known in the art.

The quantity of charging events and the state of charge at the end of each charging event may be stored in a memory (not shown) of the battery 203 and read by the processor 205, or be reported to the processor 205. The processor 205 may then consider only those charging events that resulted in ending states of charge of less than a predetermined percentage of the full state of charge for the battery 203 as being partial charge cycles. For example, the processor 205 may determine that charging events in which the ending battery state of charge is less than 90% or 95% of the battery's full state of charge qualify as partial charge cycles. The processor 205 determines the quantity of partial charge cycles that have occurred up until the time at which the current quantity of charge-discharge cycles is being computed.

The computed quantity of partial charge cycles is multiplied by a partial charge factor to determine the adjusted quantity of partial charge cycles used in this embodiment's computation of the quantity of charge-discharge cycles. The partial charge factor accounts for lower amounts of battery degradation when the battery 203 is not charged fully and may be determined experimentally through cycle life testing with partial charging. After the cycle life factor, the partial charge factor, the quantity of partial charge cycles, and the cumulative capacity-to-full capacity ratio have been determined, the processor 205 may compute the quantity of charge-discharge cycles as detailed above.

In an alternative embodiment involving a relationship between temperature offset value and battery aging factor prestored in the memory 207 (e.g., in a lookup table 219), the stored relationship may be between temperature offset value and aged heat generation value ($Q_{aged}$) for the battery 203. In this case, the processor 205 measures the impedance of the battery in real time during operation of the electronic system 201 by measuring the voltage of the battery 203 and the current being drawn from the battery 203 at two different times (or at a new time when the voltage and current were previously measured at a prior time) and divides the voltage difference by the current difference to obtain the aged impedance (R). The aged impedance is then multiplied by the square of the most recently measured current ($I^2$) to obtain the aged heat generation value ($Q=I^2 \times R$) for the battery 203. As discussed above, the regulation circuit 307 may include a voltage detector and a coulomb counter or other current detection circuit that are readable by the processor 205 during operation of the electronic system 201 to enable the processor 205 to determine the voltages and currents required for the battery impedance calculation. After determining the current aged heat generation value, the processor 205 may retrieve the associated temperature offset value from the lookup table 219 by selecting the temperature offset value corresponding to an aged heat generation value that is closest to the determined aged heat generation value. The battery's impedance and the resulting aged heat generation value may be determined periodically (daily, monthly, weekly, and so forth) or upon occurrence of a predefined triggering event, such as completion of a predetermined quantity of charging events, the battery's open circuit voltage dropping below a threshold voltage, or any other event that may affect the aging of the battery 203.

In a further alternative embodiment involving a relationship between temperature offset value and battery aging factor prestored in the memory 207 (e.g., in a lookup table 219), the stored relationship may be between temperature offset value and a heat generation factor (HGF) for the battery 203. In this case, the processor 205 measures the impedance of the battery in real time during operation of the electronic system 201 and determines the aged heat generation value ($Q_{aged}=I^2 \times R$) for the battery 203 as discussed above. Additionally, the processor 205 retrieves from the memory 207 an initial heat generation value 223 ($Q_{new}$), which was determined in the manner detailed above and prestored in the memory 207. The processor 205 subtracts the initial heat generation value 223 from the aged heat generation value and divides the difference by the aged heat generation value to produce the real time heat generation factor (HGF=$(Q_{aged}-Q_{new})/Q_{aged}$)). After determining the current heat generation factor, the processor 205 may retrieve the associated temperature offset value from the lookup table 219 by selecting the temperature offset value corresponding to a heat generation factor that is closest to the determined heat generation factor. The battery's impedance and the resulting heat generation factor may be determined periodically or upon occurrence of a predefined triggering event that may affect the aging of the battery 203.

In a further embodiment of the present invention, the temperature offset value may be determined in real-time based on one or more aging factors for the battery 203 and one or more prestored initial values. For example, the temperature offset value may be determined based on an initial temperature offset value 221 and a heat generation factor for the battery 203, where the heat generation factor is based on an initial heat generation value 223 and an aged heat generation value for the battery 203. In this case, the real-time impedance (R) of the battery 203 may be measured during operation of the electronic system 201 as discussed above (i.e., $R=(V_2-V_1)/(I_2-I_1)$). Additionally, a quantity of heat ($Q_{aged}$) generated by the battery 203 during operation of the electronic system 203 may be determined based on the real-time battery impedance, as also discussed above (i.e., $Q_{aged}=I_2^2 \times R$). The real-time heat generation factor (HGF) may then be determined based on the aged heat generation value. In particular, the processor 205 may retrieve the initial heat generation value 223 from the memory 207, subtract the initial heat generation value 223 from the aged heat generation value, and divide the difference by the aged heat generation value to produce the heat generation factor (i.e., HGF=$(Q_{aged}-Q_{new})/Q_{aged}$)). In this case, the processor 205 may determine the current temperature offset value by retrieving the initial temperature offset value 221 from the memory 207, multiplying the initial temperature offset value 221 by the heat generation factor to produce a scaled initial temperature offset value, and summing the scaled initial temperature offset value and the initial temperature offset value 221. In other words, the current temperature offset value may be computed from the following equation: Temp Offset Value=(HGF×Initial Offset Value)+Initial Offset Value. The battery's impedance and the resulting heat generation factor may be determined periodically or upon occurrence of a predefined triggering event that may affect the aging of the battery 203, such as completion of a predetermined quantity of charging events, the battery's open circuit voltage dropping below a threshold voltage, the battery's voltage exceeding a threshold, a calendar time, a user request or reset, or a combination of these events.

Referring back to FIG. 4, after the processor 205 senses (401) the temperature of the battery 203 proximate the battery's cell 301 and determines (403) a temperature offset value based on a battery aging factor, the processor adjusts (405) the sensed temperature value based on the temperature offset value to produce an adjusted temperature value representative of the thermal state of the battery 203. The temperature offset value, which may be positive or negative depending upon the results of the computations described above, is added to the sensed temperature value to determine the adjusted temperature value. The adjusted temperature value is, therefore, the estimated maximum temperature of the battery 203 at the particular point in time at which the adjusted temperature value is calculated and takes into account battery aging. As a result, the adjusted temperature value is a more accurate representation of the thermal state of the battery 203 than is the temperature represented by the output voltage of the temperature sensing circuit 303.

After the adjusted temperature value has been determined, the processor 205 may compare (407) the adjusted temperature value to a threshold to determine whether the battery temperature may be at an undesirable level, such as in thermal runaway. Alternatively, the adjusted temperature value may be converted to a voltage and applied to an operational amplifier comparator or other known comparator hardware implementation. If the adjusted temperature value is at or below the threshold, the processor 205 continues to re-determine the adjusted temperature value periodically or at other appropriate times. On the other hand, if the adjusted temperature value exceeds the threshold, the processor 205 or electronic system hardware may commence (409) a thermal management event in an attempt to reduce the temperature of the battery 203. The thermal management event may include turning off or limiting various components or circuits in the system load 209 to reduce the current drain and heat of the battery 203, sending an alert to a remote diagnostic server, notifying the user, or storing an alert in a local log file. When a thermal management event is commenced, the processor 205 may also provide data to the display 211 to cause a notification to be displayed on the display 211 to inform a user of the electronic system 201 that a thermal management event has been commenced.

The present invention encompasses a method and apparatus for determining a thermal state of a battery used in an electronic system taking into account battery aging. With this invention, an electronic system or a battery thermal management system used therein may more accurately estimate the thermal state of the battery as a battery ages and exhibits associated aging effects, which occur with certain battery technologies. In this manner, the present invention provides more accurate thermal protection for battery technologies that require it and reduces the likelihood of inadvertent operation of a battery above its critical temperature limit. Additionally, the enhanced thermal assessment provided by the present invention reduces premature degradation of the battery cycle life due to inadvertent overheating.

As detailed above, embodiments of the present invention reside primarily in combinations of method steps and/or apparatus components related to determining a thermal state of a battery used in an electronic system. Accordingly, the apparatus components and method steps have been represented, where appropriate, by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as "first" and "second," "top" and "bottom," and the like may be used solely to distinguish one entity or action from another entity or action without necessarily requiring or implying any actual relationship or order between such entities or actions. The terms "comprises," "comprising," "includes," "including," "has," "having," "contains," "containing," and any other variations thereof are intended to cover a non-exclusive inclusion, such that a process, method, article, or apparatus that comprises, includes, has, or contains a list of elements does not include only those elements but may include other elements not expressly listed or inherent to such process, method, article, or apparatus. The term "plurality of" as used in connection with any object or action means two or more of such object or action. A claim element proceeded by the article "a" or "an" does not, without more constraints, preclude the existence of additional identical elements in the process, method, article, or apparatus that includes the element.

It will be appreciated that embodiments of the electronic system 201 described herein may be comprised of one or more conventional processors and unique stored program instructions that control the processor(s) to implement, in conjunction with certain non-processor circuits, some, most, or all of the functions of the electronic system 201 and its operational methods as described herein. The non-processor circuits may include, but are not limited to, storage devices (such as memory 207), the temperature sensing circuit 303, the battery charging circuit 30, the output voltage regulation circuit 307, and the display 211 described above, as well as filters, clock circuits, and various other non-processor circuits. As such, the functions of the processor and non-processor circuits may be collectively interpreted as steps of a method for determining a thermal state of a battery used in an electronic system. Alternatively, some or all functions could be implemented by a state machine that has no stored program instructions, or in one or more application specific integrated circuits (ASICs), in which each function or some combinations of certain of the functions are implemented as custom logic. Of course, a combination of the various approaches could be used. Thus, methods and means for these functions have been generally described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions or programs and integrated circuits without undue experimentation.

In the foregoing specification, specific embodiments of the present invention have been described. However, one of ordinary skill in the art will appreciate that various modifications and changes can be made without departing from the scope of the present invention as set forth in the appended claims. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as critical, required, or essential features or elements of any or all the claims. The invention is defined solely by the appended claims and all equivalents of those claims as issued.

What is claimed is:

1. A method for determining a thermal state of a battery used in an electronic system, the battery including one or more cells, the method comprising:
   sensing, within the electronic system, temperature at a position outside the one or more cells of the battery during operation of the electronic system to produce a sensed temperature value, wherein the sensed temperature value is related to a temperature within the one or more cells by way of a temperature offset value that varies with an age of the battery;
   determining an aging factor indicative of the age of the battery;
   determining the temperature offset value based on the aging factor for the battery; and
   adjusting the sensed temperature value based on the temperature offset value to produce an adjusted temperature value representative of the temperature within the one or more cells.

2. The method of claim 1, wherein determining the temperature offset value based on the aging factor for the battery comprises:
   retrieving the temperature offset value from a memory of the electronic system based on the aging factor, wherein a relationship between temperature offset value and aging factor for the battery was prestored in the memory.

3. The method of claim 1, wherein the aging factor for the battery comprises a quantity of charge-discharge cycles for the battery.

4. The method of claim 3, further comprising:
   detecting a cumulative capacity of the battery during operation of the electronic system; and
   determining the quantity of charge-discharge cycles based on the cumulative capacity.

5. The method of claim 4, wherein determining the temperature offset value based on an aging factor for the battery comprises:
   retrieving the temperature offset value from a memory of the electronic system based on the quantity of charge-discharge cycles, wherein a relationship between temperature offset value and quantity of charge-discharge cycles for the battery was prestored in the memory.

6. The method of claim 4, wherein determining the quantity of charge-discharge cycles based on the cumulative capacity comprises:
   determining a ratio of the cumulative capacity to a full capacity for the battery to produce the quantity of charge-discharge cycles.

7. The method of claim 4, wherein determining the quantity of charge-discharge cycles based on the cumulative capacity comprises:
   determining a ratio of the cumulative capacity to a full capacity for the battery;
   multiplying the ratio by a cycle life fade factor for the battery to produce an adjusted ratio; and
   summing the ratio and the adjusted ratio to produce the quantity of charge-discharge cycles.

8. The method of claim 4, wherein determining the quantity of charge-discharge cycles based on the cumulative capacity comprises:
   determining a ratio of the cumulative capacity to a full capacity for the battery;
   multiplying the ratio by a cycle life fade factor for the battery to produce an adjusted ratio;

determining a quantity of partial charge cycles for the battery;

multiplying the quantity of partial charge cycles by a partial charge factor to produce an adjusted quantity of partial charge cycles;

summing the ratio and the adjusted ratio to produce a summation; and subtracting the adjusted quantity of partial charge cycles from the summation to produce the quantity of charge-discharge cycles.

9. The method of claim 8, wherein determining the quantity of partial charge cycles for the battery comprises:

determining occurrences of a plurality of charging events for the battery;

determining a state of charge for the battery at an end of each charging event;

determining that a particular charging event is a partial charge cycle when the state of charge for the battery at the end of the particular charging event is less than a predetermined percentage of a full state of charge for the battery; and determining the quantity of partial charge cycles based on a quantity of charging events that qualify as partial charge cycles.

10. The method of claim 9, wherein determining the state of charge for the battery at the end of each charging event comprises:

determining an open circuit output voltage of the battery at the end of each charging event; and determining the state of charge for the battery based on the open circuit voltage.

11. The method of claim 1, wherein the aging factor comprises a heat generation factor for the battery.

12. The method of claim 11, further comprising:

measuring an impedance of the battery during operation of the electronic system to produce an aged battery impedance;

determining a quantity of heat generated by the battery during operation of the electronic system based on the aged battery impedance to produce an aged heat generation value; and determining the heat generation factor based on the aged heat generation value.

13. The method of claim 12, wherein determining the heat generation factor based on the aged heat generation value comprises:

retrieving an initial heat generation value from a memory of the electronic system, the initial heat generation value representing an amount of heat generated by the battery prior to aging of the battery;

subtracting the initial heat generation value from the aged heat generation value to produce a heat generation value difference; and dividing the heat generation value difference by the aged heat generation value to produce the heat generation factor.

14. The method of claim 12, wherein determining the temperature offset value based on the aging factor for the battery comprises:

retrieving an initial temperature offset value from a memory of the electronic system, the initial temperature offset value representing a temperature offset value applied to the sensed temperature value prior to aging of the battery;

multiplying the initial temperature offset value by the heat generation factor to produce a scaled initial temperature offset value; and summing the scaled initial temperature offset value and the initial temperature offset value to produce the temperature offset value.

15. The method of claim 12, wherein measuring the impedance of the battery during operation of the electronic system comprises:

measuring the impedance of the battery periodically.

16. The method of claim 12, wherein measuring the impedance of the battery during operation of the electronic system comprises:

measuring the impedance of the battery upon occurrence of a triggering event.

17. The method of claim 11, wherein determining the temperature offset value based on the aging factor for the battery comprises:

retrieving an initial temperature offset value from a memory of the electronic system, the initial temperature offset value representing a given temperature offset value applied to the sensed temperature value prior to aging of the battery;

multiplying the initial temperature offset value by the heat generation factor to produce a scaled initial temperature offset value; and summing the scaled initial temperature offset value and the initial temperature offset value to produce the temperature offset value.

18. The method of claim 1, wherein the aging factor comprises an aged heat generation value for the battery.

19. The method of claim 18, wherein determining the temperature offset value based on the aging factor for the battery comprises:

measuring an impedance of the battery during operation of the electronic system to produce an aged battery impedance;

determining a quantity of heat generated by the battery during operation of the electronic system based on the aged battery impedance to produce the aged heat generation value for the battery; and retrieving, from a memory of the electronic system, the temperature offset value corresponding to the aged heat generation value for the battery, wherein a relationship between the temperature offset value and aged heat generation value for the battery is prestored in the memory.

20. A thermal management system for use with a battery that supplies electrical power for an electronic system, the thermal management system comprising:

a temperature sensing circuit positioned outside one or more cells of the battery, the temperature sensing circuit configured to output a value representative of a sensed temperature, wherein the value is related to a temperature within the one or more cells by way of a temperature offset value that varies with an age of the battery;

a processor in communication with the temperature sensing circuit;

a non-transitory memory having stored thereon operating instructions that are executable by the processor to:

determine an aging factor indicative of the age of the battery;

determine the temperature offset value based on the aging factor for the battery; and adjust the value representative of the sensed temperature based on the temperature offset value to produce an adjusted temperature value representative of the temperature within the one or more cells.

21. The thermal management system of claim 20, wherein the operating instructions are further executable by the processor to:
compare the adjusted temperature value to a threshold; and
commence a thermal management event when the adjusted temperature value exceeds the threshold.

22. The thermal management system of claim 20, wherein the aging factor comprises at least one of a quantity of charge-discharge cycles for the battery, a heat generation factor for the battery, and a quantity of charging events for the battery.

23. The thermal management system of claim 20, wherein the operating instructions are further executable by the processor to determine the temperature offset value based on the aging factor for the battery by:
determining a cumulative capacity of the battery during operation of the electronic system;
determining a quantity of charge-discharge cycles based on the cumulative capacity; and
determining the temperature offset value based on the quantity of charge-discharge cycles.

24. The thermal management system of claim 20, wherein the operating instructions are further executable by the processor to determine the temperature offset value based on the aging factor for the battery by:
retrieving an initial temperature offset value from the memory, the initial temperature value offset representing a given temperature offset value applied to the sensed temperature prior to aging of the battery;
retrieving an initial heat generation value from the memory, the initial heat generation value representing an amount of heat generated by the battery prior to the aging of the battery;
determining an impedance of the battery during operation of the electronic system to produce an aged battery impedance;
determining a quantity of heat generated by the battery during operation of the electronic system based on the aged battery impedance to produce an aged heat generation value;
subtracting the initial heat generation value from the aged heat generation value to produce a heat generation value difference;
dividing the heat generation value difference by the aged heat generation value to produce a heat generation factor;
multiplying the initial temperature offset value by the heat generation factor to produce a scaled initial temperature offset value; and
summing the initial scaled temperature offset value and the initial temperature offset value to produce the temperature offset value.

25. The thermal management system of claim 20, wherein the operating instructions are further executable by the processor to determine the temperature offset value based on the aging factor for the battery by:
determining an impedance of the battery during operation of the electronic system to produce an aged battery impedance;
determining a quantity of heat generated by the battery during operation of the electronic system based on the aged battery impedance to produce an aged heat generation value; and
retrieving the temperature offset value from the memory based on the aged heat generation value, wherein a relationship between the temperature offset value and the aged heat generation value for the battery is pre-stored in the memory.

26. An electronic system comprising:
a battery including one or more cells;
a temperature sensing circuit positioned outside the one or more cells of the battery, the temperature sensing circuit configured to output a value representative of a sensed temperature, wherein the value is related to a temperature within the one or more cells by way of a temperature offset value that varies with an age of the battery; and
a processor in communication with the temperature sensing circuit;
a non-transitory memory having stored thereon operating instruction that are executable by the processor to:
determine an aging factor indicative of the age of the battery;
determine the temperature offset value based on the aging factor for the battery; and
adjust the value representative of the sensed temperature based on the temperature offset value to produce an adjusted temperature value representative of the temperature within the one or more cells.

27. The electronic system of claim 26, wherein the operating instruction are further executable by the processor to:
compare the adjusted temperature value to a threshold; and
commence a thermal management event when the adjusted temperature value exceeds the threshold.

28. The electronic system of claim 26, further comprising:
a display operably coupled to the processor;
wherein the operating instruction are further executable by the processor to cause a notification to be displayed on the display to inform a user of the electronic system that the thermal management event has been commenced.

29. The electronic system of claim 26, wherein the electronic system comprises one of a smartphone, a cellular phone, a multimedia player, a personal digital assistant, a portable gaming device, a tablet computer, and a laptop computer.

* * * * *